United States Patent
Chaussy et al.

[11] Patent Number: 5,473,249
[45] Date of Patent: Dec. 5, 1995

[54] SUPERCONDUCTIVE DEVICE INCLUDING A SUPERCOOLED FIRST BODY HEATED BY ELECTROMAGNETIC RADIATION AT A FIRST FREQUENCY AND A SUPERCOOLED SECOND BODY HEATED AT A SECOND FREQUENCY GREATER THAN THE THE FIRST FOR MEASURING A MAGNETIC FIELD

[75] Inventors: Jacques Chaussy, Echirolles; Frédéric Ayela, Grenoble; Jean-Louis Bret, Seyssins, all of France

[73] Assignees: Framatome, Courbevoie; Centre National de la Recherche Scientifique, Paris, both of France

[21] Appl. No.: 151,821

[22] Filed: Nov. 15, 1993

[30] Foreign Application Priority Data

Nov. 13, 1992 [FR] France .................................. 92 13692

[51] Int. Cl.$^6$ ...................... G01R 33/035; G01R 33/02
[52] U.S. Cl. .......................................... 324/248; 505/845
[58] Field of Search ............................. 324/248; 505/162, 505/845, 846; 327/370, 371, 372, 365

[56] References Cited

U.S. PATENT DOCUMENTS

| | | | |
|---|---|---|---|
| 3,435,337 | 3/1969 | Inouye et al. | 324/248 |
| 3,437,919 | 4/1969 | Dimeff | 324/248 |
| 3,470,461 | 9/1969 | Morse | 505/845 |

FOREIGN PATENT DOCUMENTS 406066  2/1991  European Pat. Off. ............... 324/248

Primary Examiner—Sandra L. O'Shea
Assistant Examiner—Roger Phillips
Attorney, Agent, or Firm—Pollock, Vande Sande & Priddy

[57] ABSTRACT

The device includes a first body (1) of superconducting material placed in the magnetic field to be measured, an arrangement (7) suitable for successively changing the temperature of this first body above and below its transition temperature, at a first frequency, so as to generate field variations in the vicinity of the body, and an arrangement for determining the field from these variations. The arrangement includes a second body (4) of superconducting material, placed in the vicinity of the first body (1), an optical fiber (8) suitable for changing the temperature of at least one portion of this second body, above and below its transition temperature, at a second frequency greater than the first frequency, in order to generate, in this second body, current variations proportional to the field variations. These current variations are then measured and the field is determined from these variations.

16 Claims, 3 Drawing Sheets

SUPERCONDUCTIVE DEVICE INCLUDING A SUPERCOOLED FIRST BODY HEATED BY ELECTROMAGNETIC RADIATION AT A FIRST FREQUENCY AND A SUPERCOOLED SECOND BODY HEATED AT A SECOND FREQUENCY GREATER THAN THE THE FIRST FOR MEASURING A MAGNETIC FIELD

FIELD OF THE INVENTION

The present invention relates to a device for measuring a magnetic field using bodies of superconducting material placed in the magnetic field to be measured, and enabling absolute measurement of a very weak magnetic field.

BACKGROUND OF THE INVENTION

A number of devices of this type are already known in the art, such as, for example, superconducting quantum interferometers (Superconducting Quantum Interferences Devices or "SQUIDs"). The operation of these interferometers is based on phenomena linked to the superconductivity of the materials used, such as magnetic flux quantization and the Josephson effects.

In fact, when a ring of metallic material is cooled until it passes into the superconducting state, in the presence of a magnetic field, and then this field is cut, it has been noted that the magnetic flux, which quantity represents the product of the field in the ring and the area of the latter, remains trapped in the ring. The flux is held by a superconduction current which has been created in the ring to oppose the flux variations, according to Lenz's law, and persists there permanently. Thus, the current induced in the ring is representative of the flux and therefore of the magnetic field which it is desired to determine. Measuring this current therefore makes it possible to deduce the magnetic field. However, this measurement has some drawbacks.

In fact, in a so-called direct-current Josephson-effect interferometer, the superconducting ring includes two barriers. When a magnetic field is applied, these become resistive and a potential difference is created between the parts of the ring separated by the barriers. The potential difference can then be measured and makes it possible to determine the magnetic flux.

In so-called alternating-current Josephson-effect interferometers, the ring has only a single barrier and is therefore easier to manufacture. However, it is more difficult to detect the entry of the barrier into the resistive state, and this problem is solved by exploiting the low inductance of the ring. This ring is in fact coupled by mutual induction to an external oscillating circuit which induces an alternating current therein at frequencies ranging from ten MHz up to ultra-high frequencies. The variations of the current in the ring, which are induced by the magnetic field to be measured, are then manifested by variations in the level of oscillation of the external circuit, which variations can be measured in order to determine the magnetic field.

It is conceivable that this type of superconducting quantum interferometer using the Josephson effect makes it possible to detect only variations in magnetic flux. These high-performance devices require, for their production, control of techniques which are highly advanced and therefore very expensive. They are actually extremely difficult to manufacture insofar as it is necessary to produce tunnel junctions constituting the barriers described above and to use highly complex associated measurement electronics.

For further teaching on these interferometers, reference should be made to the articles published in the journals "La Recherche", No. 133 (May 1982), pages 604 to 613, and "Pour la Science", No. 138 (April 1989), pages 52 to 61.

A cryogenic magnetometer is also known, for example from U.S. Pat. No. 3,437,919. This magnetometer comprises a detection coil arranged between two discs of superconducting material. The discs are held at a temperature of less than 10° K. in a cryostat filled with liquid helium.

The temperature of the discs is periodically and simultaneously altered so that it is alternately less than and greater than their superconducting transition temperature.

Because of this, the magnetic flux to be measured passes through the discs and the detection coil at the same frequency as the temperature changes of the discs.

A magnetometer is also known, from FR-A 2,648,568, in which a thin film of superconducting material, which is for example in the shape of a disc, is heated using light radiation transmitted by an optical fiber. The thin film of superconducting material then passes alternately above and below its superconducting transition temperature, which allows the flux lines of the magnetic field to be measured to pass. A measurement coil is arranged around the thin film in order to detect the magnetic field variations.

However, the application of these devices to the detection and measurement of very weak magnetic fields requires complete thermal transition cycles at high frequency over the entire surface of the discs. A very great difficulty then arises, this difficulty consisting in not trapping the field lines in a disc when it is cooled below its superconducting transition temperature.

To avoid this trapping, it is necessary for the cooling to occur evenly from the center of the disc to its periphery.

However, controlling this regulation limits the thermal modulation frequency and therefore the sensitivity of the device.

The object of the invention is to solve these problems.

SUMMARY OF THE INVENTION

To this end, the subject of the invention is a device for measuring a magnetic field, of the type including a first body of superconducting material placed in the magnetic field to be measured, means suitable for successively changing the temperature of this first body of superconducting material above and below its superconducting transition temperature, at a first frequency, and therefore changing this first body from a first state in which it is permeable to the field lines, when its temperature is greater than its superconducting transition temperature, into a second state in which it is impermeable to the field lines, when its temperature is less than its superconducting transition temperature, and vice versa, so as to generate magnetic field variations in the vicinity of the body, and means for detecting these field variations and for determining the field from these variations. The detection and determination means include a second body of superconducting material, placed in the magnetic field to be measured, in the vicinity of the first body, means suitable for changing the temperature of at least one portion of this second body of superconducting material, above and below its superconducting transition temperature, at a second frequency greater than the first, in order to generate, in this second body, current variations proportional to the field variations induced by the first body, means for measuring these current variations in order to determine the corresponding field variations and means for determining the field from these variations.

Advantageously, the means for determining the field are connected to means for generating a field opposite to the field determined, in order to reinitialize the device at the second frequency and to allow determination of the absolute value of the field.

The invention will be better understood with the aid of the following description which is given solely by way of example and with reference to the attached drawings, in which:

DETAILED DESCRIPTION

Figure 1:
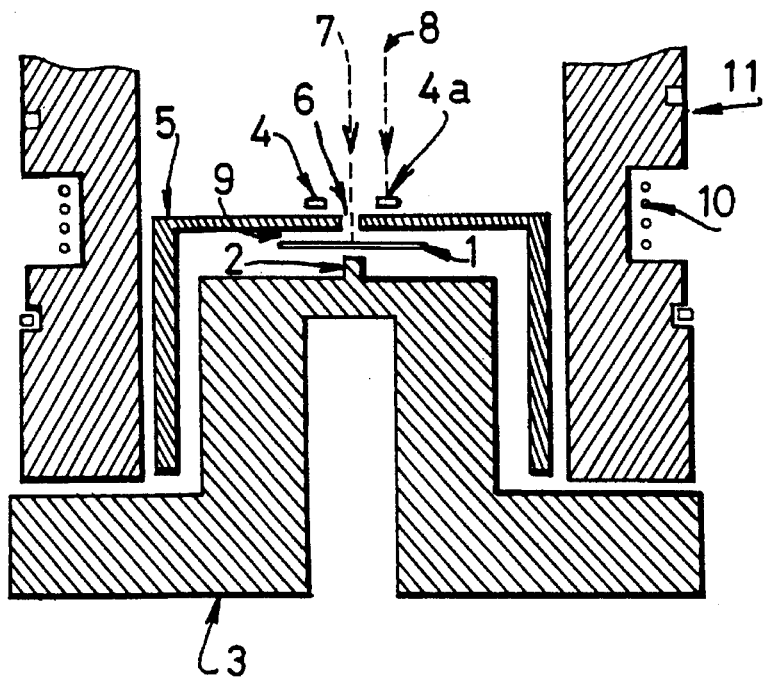
FIG. 1 is a schematic sectional view of a measurement device according to the invention.
Figure 2:
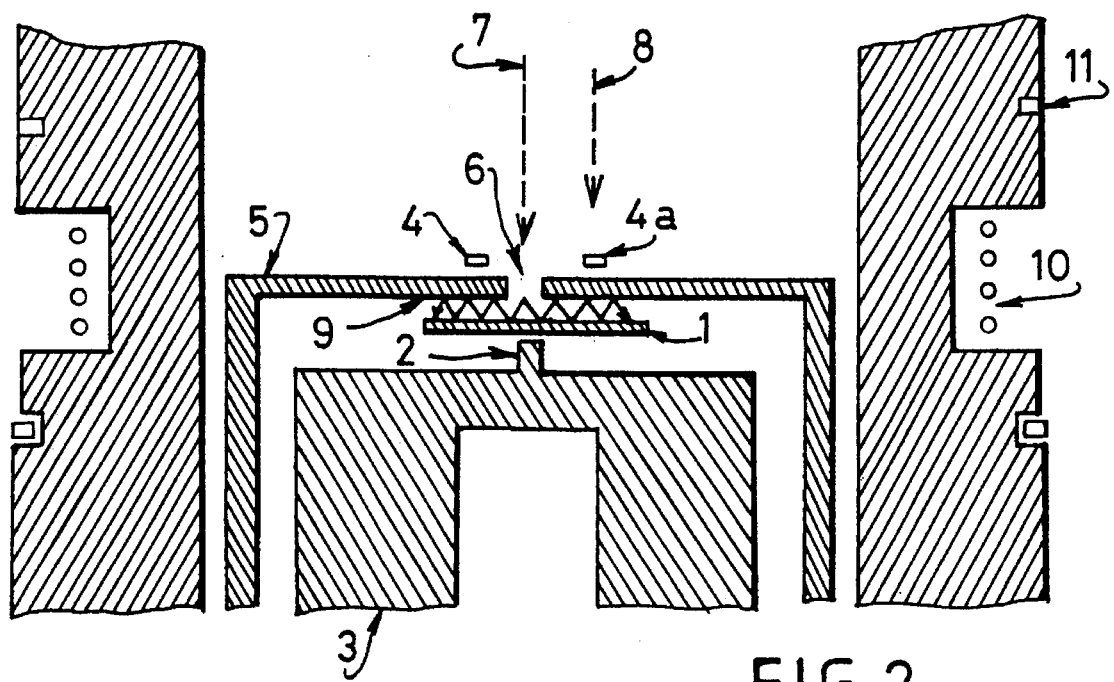
FIG. 2 is a detail view, on an enlarged scale, of part of the measurement device represented in FIG. 1.

As can be seen in FIGS. 1 and 2, a device according to the invention for measuring a magnetic field includes a first body of superconducting material placed in the magnetic field to be measured. This body is, for example, in the shape of a disc 1 arranged on a support block 2 of a base 3.

This first body of superconducting material is associated with means suitable for successively changing the temperature of this body above and below its superconducting transition temperature, at a first frequency, and therefore changing this first body from a first state in which it is permeable to the field lines, when its temperature is greater than its superconducting transition temperature, into a second state in which it is impermeable to the field lines, when its temperature is less than its superconducting transition temperature, and vice versa.

As has been described in the above-mentioned FR-A-2, 648,568, this makes it possible to generate magnetic field variations in the vicinity of the body. Means for detecting these field variations and for determining the field from these variations are provided in the vicinity of this first body, and these detection and determination means include a second body 4 of superconducting material.

This second body is advantageously in the shape of a ring of superconducting material, for example identical to that forming the disc 1, but whose diameter is less than that of the disc. This ring is advantageously formed by deposition of material on a support structure 5 arranged above the base 3, and is provided on the face of this support structure 5 opposite that facing the disc 1 and arranged symmetrically around an orifice 6 of the support structure. The central part of the disc 1 is also situated facing this orifice, the function of which will be described in more detail below.

The support structure and the base 3 are made of an electrically insulating material, for example of ceramic, making it possible to hold the disc and the ring in position relative to each other and acting as thermal elements so as not to introduce an excessively long time constant for heating or cooling, for example, the disc.

In addition, provision of separate support elements for the disc and the ring makes it possible to decouple the temperatures of these two members.

The first and second bodies are arranged in a cryostat which will be described in more detail below, at a temperature less than their superconducting transition temperature, and means for heating at least one portion of these bodies are provided.

The means for heating each body advantageously comprise means for generating optical radiation, which are each arranged at one end of a light guide, outside the cryostat, the other end of each guide facing the corresponding body in the cryostat, as illustrated by the references 7 and 8 in FIGS. 1 and 2. The light guide, for example 7, associated with the disc 1 and consisting for example of at least one optical fiber, has one end facing the central part of the disc, which part is situated facing the orifice 6 of the support structure 5, in order to heat this disc.

From this point it will be noted that the surface of the face of the support structure 5 facing the disc may be reflective, as illustrated by the reference 9.

This face is then treated so that the cavity formed between the disc and this face acts as a black body. The corresponding surface of the disc may also be polished so that the optical beam delivered by the light guide 7 and passing through the orifice 6 is reflected by the disc 1 and the corresponding face 9 of the support structure, in order to obtain good distribution of this beam over the entire surface of the disc.

The light guide 8 is intended to allow heating of the zone 4a of the ring 4 at a higher frequency than that used for the disc.

It is then clear that this combination of means for periodic heating of the disc and of a zone of the ring makes it possible to generate, in the vicinity of the disc, magnetic field variations which are manifested by current variations proportional to these field variations induced by the first body, i.e., by the disc, in the second body, i.e., in the ring.

Means 10 for measuring these current variations are associated with the ring in order to determine the corresponding magnetic field variations and to make it possible to determine the field from the measurements delivered by these means.

Advantageously, these measurement means associated with the ring comprise a coil formed of at least one turn of superconducting material arranged around the ring.

This measurement coil may be integrated in a resonant circuit in which a capacitor is connected to the terminals of the coil, the resonant frequency of this resonant circuit being equal to the second frequency, i.e., to the frequency of switching of the temperature in the zone 4a of the ring above and below its superconducting transition temperature, and making it possible to determine the field by measuring the voltage at the terminals of the coil.

Finally, these means for determining the field may be connected to means 11 for generating a field opposite to the field determined, in order to reinitialize the device at the second frequency and to allow determination of the absolute value of the field.

These generation means comprise, for example, at least one Helmholtz coil connected to conventional-type supply means controlled by the determination means and having an output voltage which is an image of the magnetic field determined.

Figure 3:
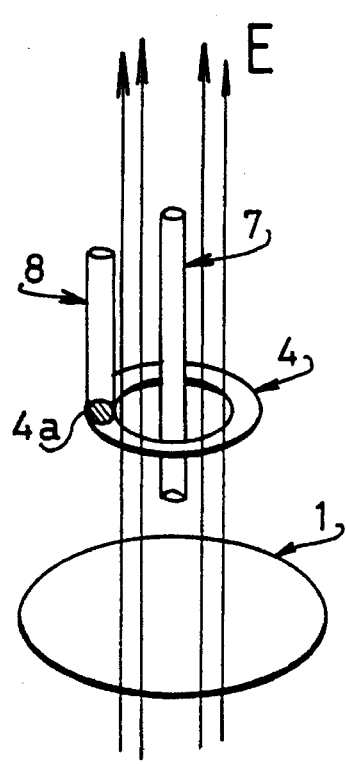
FIGS. 3 and 4 illustrate the principle of operation at a measurement device according to the invention.
Figure 4:
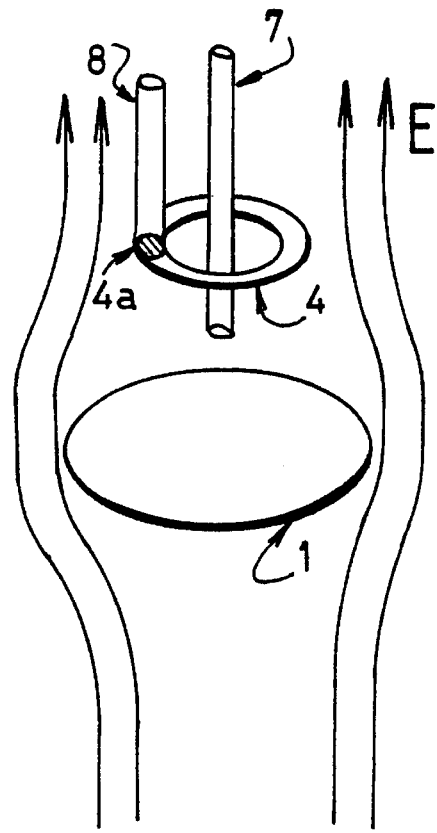

FIGS. 3 and 4 illustrate the principle of operation of the measurement device according to the invention.

As can be seen in these figures, as long as the temperature of the disc 1 and of the zone 4a of the ring 4 is greater than the critical value, i.e., than the superconducting transition temperature, the device is in a first state in which it is permeable to the field lines E. If the optical power delivered by the fiber 7 i.e., if the heating power, decreases, so that the disc 1 is entirely superconducting, this body becomes impermeable to the magnetic field lines, as illustrated in FIG. 4. The ring 4, whose zone 4a has remained normal during the cooling of the disc 1, is then located in the field hole.

The alternating high-frequency thermal modulation of this zone on either side of its critical value, using the beam emitted by the optical fiber 8, does not induce any signal.

If the disc 1 is progressively heated using the beam delivered by the fiber 7, while causing the temperature of the zone 4a of the ring 4 to pass, for example at a frequency of the order of 100 kHz, above and below its transition temperature, when the temperature of the disc approaches its critical value, a magnetic vortex will pass through the disc. This flux variation, developing over a time greater than the transition period of the zone 4a of the ring 4, will induce in this ring a sharp current variation, which is detected by the detection coil 10.

This process is repeated during the rest of the heating of the disc 1 until all the magnetic field lines E have returned to an initial state.

It is then clear that the measurement coil 10 makes it possible to determine the magnetic field in which these bodies are placed by measuring the variations in current flowing in the ring, these variations being proportional to the field variations induced by the disc.

The measurement coil may be connected to any conventional-type supply means whose output is connected to the Helmholtz coils 11 described above, in order to generate a magnetic field of amplitude equal to the number of flux quanta detected during the phase of heating the disc 1, but of opposite sign, in order to reinitialize the device at the second frequency and to allow determination of the absolute value of the field.

In fact, with the disc 1 remaining in its normal phase, the residual flux passing through the ring 4 has a value less than the initial flux $\Phi 0$, and the high-frequency switching of the temperature of the zone 4a of the ring 4 provides a signal proportional to the residual field, which can be cancelled using the Helmholtz coils 11.

It is then clear that knowledge of the voltage applied to these coils makes it possible to determine an absolute value of the field.

Figure 5:
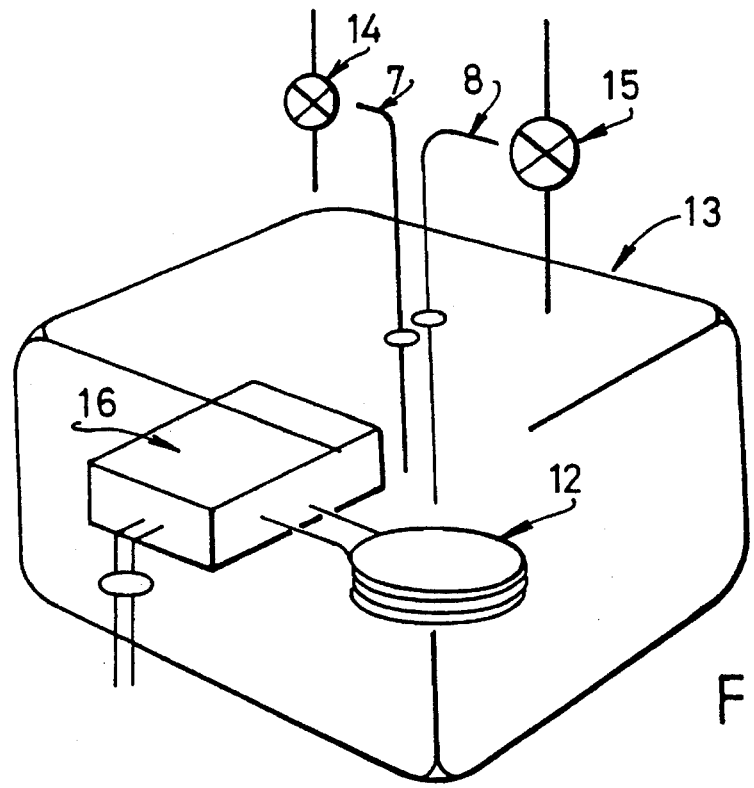
FIG. 5 illustrates the installation of the various components of a measurement device according to the invention in a cryostat.

As can be seen in FIG. 5, measurement assembly 12 may be arranged in a cryostat 13 at a temperature less than the superconducting transition temperature of the elements of the assembly. Ends of the optical fibers 7 and 8 are combined with means 14 and 15 for generating optical radiation.

These generation means arranged outside the cryostat may consist, for example, of diode lasers or light-emitting diodes.

The voltage generated at the terminals of the detection coil 10, during the measurement of the field variations, can be measured by any appropriate measurement device 16, which may, for example, be formed by the device described in Patent Application FR-92-00083, filed Jan. 7, 1992 by applicant companies.

These measurement means 16 may also be arranged in the cryostat 13 at a temperature less than the superconducting transition temperature of the two bodies mentioned previously, for example at 4 K. or more, depending on the superconducting materials used.

Figure 6A:
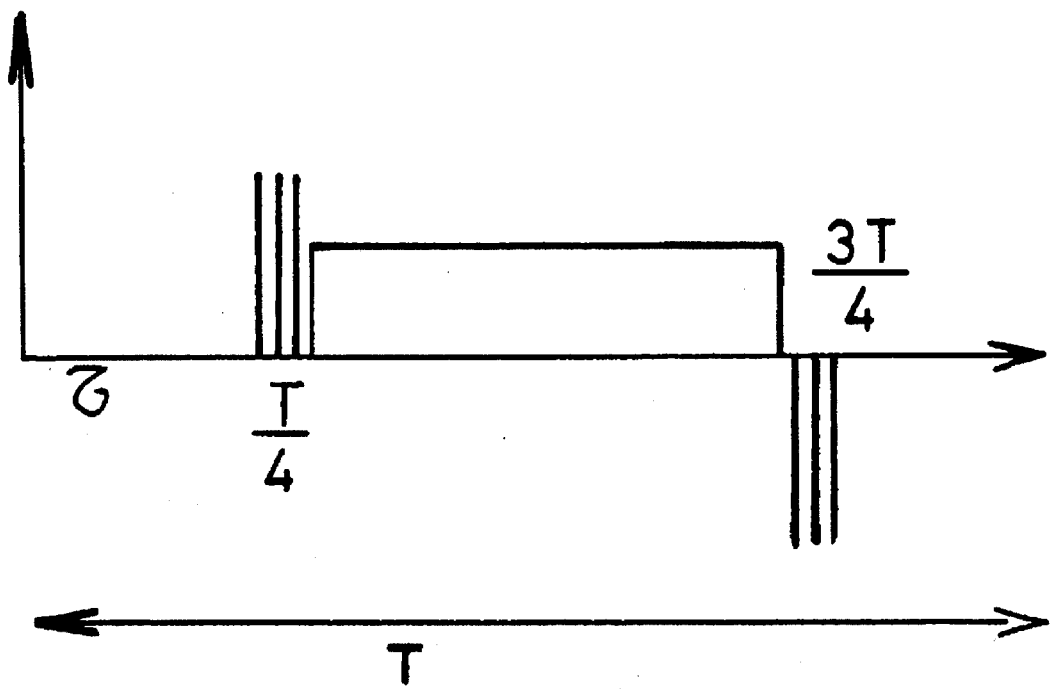
FIGS. 6A and 6B represent shapes of signals at various points of a device according to the invention.

Finally, FIG. 6A shows the response curve of a device according to the invention, the abscissa showing the time scale and the ordinate showing the amplitude of the alternating current induced, for example, in the detection coil 10.

Figure 6B:
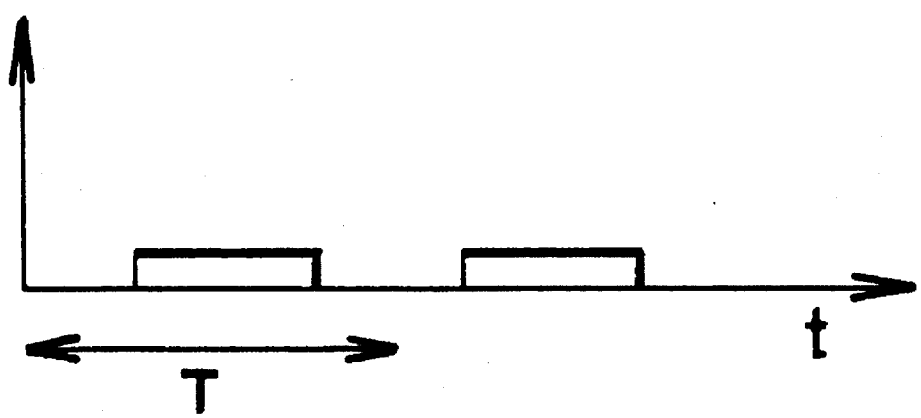

The time T (FIG. 6B), for example 10 milliseconds, represents one cycle of heating and cooling the disc 1 of superconducting material.

When T=0, the disc is in a superconducting state.

At time $T=T/4-\epsilon$, the temperature of the disc approaches its critical value and the first field lines appear in the form of a vortex.

Each line transit is detected by the ring 4, in which the temperature or zone 4a passes above and below its transition temperature with a period $\tau$, for example 10 milliseconds, and is manifested by a current pulse in this coil (FIG. 6A).

A description has previously been given of the overall operation of the device over a half-period of modulation of the disc 1, but in practice it is possible that the magnetic field feedback cannot be produced so quickly.

In this case, during the cooling of the disc 1, the remaining flux lines are progressively expelled from the disc 1 and detected by the ring 4.

It is possible to restart the thermal modulation cycle of the disc as many times as necessary until the residual field is sufficiently weak to allow the disc 1 into the normal state and to cause only the temperature of the zone 4a of the ring 4 to change.

The disc 1 then has the role of reinitializing the device.

Finally, it will be noted that the first thermal modulation frequency of the disc may, for example be of the order of 100 Hz, while the second associated with the ring may be of the order of 100 kHz.

We claim:

1. Device for measuring a magnetic field, of the type including a first body of superconducting material placed in the magnetic field to be measured, means for successively changing a temperature of said first body of superconducting material above and below its superconducting transition temperature, and therefore changing said first body, at a first frequency, from a first state in which said first body is permeable to field lines, when said first body is at a temperature greater than its superconducting transition temperature, to a second state in which said first body is impermeable to said field lines, when said first body is at a temperature less than its superconducting transition temperature, and vice versa, so as to generate magnetic field variations in the vicinity of said first body, and means for detecting said field variations and for determining a magnetic field from said field variations, and wherein the detection and determination means include a second body of superconducting material, placed in the magnetic field to be measured, in the vicinity of said first body, means suitable for changing a temperature of at least one portion of said second body of superconducting material, above and below its superconducting transition temperature, at a second frequency greater than said first frequency, in order to generate, in said second body, current variations proportional to the field variations induced by said first body, means for measuring said current variations in order to determine the corresponding field variations and means for determining the field from said current variations.

2. Device according to claim 1, wherein said means for determining the field are connected to means for generating a field opposite to the field determined, in order to reinitialize said device at said second frequency and to allow determination of an absolute value of the field.

3. Device according to claim 1, wherein said first and second bodies are arranged in a cryostat at a temperature less than their superconducting transition temperature, and said device further including means for heating at least one portion of said first and second bodies.

4. Device according to claim 3, wherein the means for heating each of said first and second bodies comprise means for generating light radiation.

5. Device according to claim 4, wherein said means for generating light radiation are each arranged at one end of a guide, outside the cryostat, the other end of each guide being arranged facing the corresponding body in said cryostat.

6. Device according to claim 5, wherein each light guide includes at least one optical fiber.

7. Device according to claim 5, wherein the means for generating the light radiation each comprise at least one of a diode laser and a light-emitting diode.

8. Device according to claim 1, wherein said second body is arranged above said first body, said first body being in the shape of a disc and said the second body being in the shape of a ring having a diameter which is smaller than a diameter of said disc.

9. Device according to claims 5 or 8 wherein said disc is arranged on a support block of a base, facing an orifice of a support structure for supporting said ring, the light guide associated with said ring having one end facing a portion of the said ring and the light guide associated with said disc having an end facing a central part of said disc located in front of said orifice of said support structure.

10. Device according to claim 9, wherein a surface of a face of said support structure facing said disc is reflective.

11. Device according to claim 1, wherein the measurement means associated with said second body comprise a coil comprising at least one turn of semiconductor material arranged around said second body.

12. Device according to claim 11, comprising a capacitor connected to terminals of said coil to form a resonant circuit.

13. Device according to claim 12, wherein the resonant frequency of said resonant circuit is equal to said second frequency.

14. Device according to claim 11, wherein the means for determining the field comprise means for measuring the voltage at terminals of said coil.

15. Device according to claim 2, wherein the means for generating the opposing field comprise at least one Helmholtz coil connected to supply means controlled by the determination means and having an output voltage which is an image of an absolute value of the magnetic field to be measured.

16. Device according to claim 1, wherein said first frequency is of the order of 100 Hz and said second frequency is of the order of 100 kHz.

* * * * *